United States Patent
Sano et al.

(10) Patent No.: US 8,164,256 B2
(45) Date of Patent: Apr. 24, 2012

(54) DISPLAY APPARATUS USING OXIDE SEMICONDUCTOR AND PRODUCTION METHOD THEREOF

(75) Inventors: Masafumi Sano, Yokohama (JP); Kenji Takahashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 137 days.

(21) Appl. No.: 12/515,190

(22) PCT Filed: Nov. 30, 2007

(86) PCT No.: PCT/JP2007/073619
§ 371 (c)(1),
(2), (4) Date: May 15, 2009

(87) PCT Pub. No.: WO2008/069286
PCT Pub. Date: Jun. 12, 2008

(65) Prior Publication Data
US 2010/0045179 A1    Feb. 25, 2010

(30) Foreign Application Priority Data

Dec. 5, 2006   (JP) .................. 2006-328307

(51) Int. Cl.
*H01L 51/50*   (2006.01)
*H01L 51/52*   (2006.01)
*H01L 51/54*   (2006.01)
*H01L 51/56*   (2006.01)
(52) U.S. Cl. .................. 313/509; 313/505; 313/506
(58) Field of Classification Search .......... 313/498–512; 257/368
See application file for complete search history.

(56) References Cited

U.S. PATENT DOCUMENTS

| | | | |
|---|---|---|---|
| 7,125,758 B2 | 10/2006 | Choi et al. | |
| 7,674,650 B2 | 3/2010 | Akimoto et al. | |
| 2002/0039814 A1* | 4/2002 | Jada et al. | 438/155 |
| 2005/0191448 A1 | 9/2005 | Suh et al. | 428/32.9 |
| 2006/0113536 A1 | 6/2006 | Kumomi et al. | 257/57 |
| 2006/0113549 A1 | 6/2006 | Den et al. | 257/79 |
| 2007/0197118 A1* | 8/2007 | Fukunaga et al. | 445/24 |
| 2008/0166475 A1* | 7/2008 | Jeong et al. | 427/126.3 |
| 2009/0149030 A1* | 6/2009 | Chang | 438/752 |
| 2010/0035378 A1* | 2/2010 | Chang | 438/104 |

FOREIGN PATENT DOCUMENTS
JP    7-235219    9/1995
(Continued)

OTHER PUBLICATIONS

U.S. Appl. No. 12/520,944, filed Jun. 23, 2009, Masato Ofuji, et al.
(Continued)

*Primary Examiner* — Anne Hines
*Assistant Examiner* — Jose M Diaz
(74) *Attorney, Agent, or Firm* — Fitzpatrick, Cella, Harper & Scinto

(57) ABSTRACT

A display apparatus includes a light-emitting layer, a pair of electrodes sandwiching the light-emitting layer, a transistor with an active layer for driving the light-emitting layer through the pair of the electrodes, and a matrix wiring portion having a scanning electrode line, a signal electrode line, and a first insulating layer. The active layer has an oxide which contains In and Zn and at least a part of which is amorphous, and further includes a second insulating layer containing hydrogen in an amount of less than $3\times10^{21}$ atoms/cm$^3$ disposed between the active layer and the first insulating layer.

21 Claims, 6 Drawing Sheets

FOREIGN PATENT DOCUMENTS

| | | |
|---|---|---|
| JP | 9-114398 | 5/1997 |
| JP | 2000-44236 | 2/2000 |
| JP | 2002-76356 | 3/2002 |
| JP | 2005-311365 A | 11/2005 |
| JP | 2006-165528 | 6/2006 |
| JP | 2006-186319 | 7/2006 |
| JP | 2006-286719 A | 10/2006 |
| TW | 200535283 | 11/2005 |
| WO | WO 2006/051994 A2 | 5/2006 |

OTHER PUBLICATIONS

Korean Office Action dated Jan. 28, 2011, in related corresponding Korean Patent Appln. No. 10-2009-7013546.

Akihiro Takagi, et al., "Carrier transport and electronic structure in amorphous oxide semiconductor, a-InGaZnO$_4$," *Thin Solid Films* 486 (2005) 38-41.

Taiwanese Office Action dated Sep. 22, 2011, in related Taiwanese Application No. 096146104 (with English translation).

* cited by examiner

DISPLAY APPARATUS USING OXIDE SEMICONDUCTOR AND PRODUCTION METHOD THEREOF

TECHNICAL FIELD

The present invention relates to a display apparatus using an oxide semiconductor and a production method thereof, and in particular, relates to a top-emission type, bottom-emission type or two-sided emitting type organic electroluminescent display apparatus or inorganic electroluminescent display apparatus.

BACKGROUND ART

ITO (Indium Tin oxide) has been used for a transparent electrode in a transmission type liquid crystal device. However, since $In_2O_3$ of a main raw material of ITO contains a rare metal, and it has been feared whether a desired amount of ITO can also be steadily supplied in future. Japanese Patent Application Laid-Open No. 2000-044236 proposes a method of producing a new transparent conductor material which has a reduced content of $In_2O_3$, has a low electrical resistance, has an optical absorption edge in ultraviolet region and has an excellent blue light transmissivity; and an electrode material using the material.

In addition, materials which can be substituted for ITO have been actively researched and developed. For instance, Japanese Patent Application Laid-Open No. H07-235219 proposes a film of zinc oxide (ZnO) and a zinc-indium-based oxide. In addition, Japanese Patent Application Laid-Open No. 2000-044236 proposes an oxide containing zinc-indium-based oxide and a specified amount of an additive such as gallium.

In addition, there has been an attempt in recent years in which not only an electrode but also a channel layer (hereinafter, also referred to as "active layer") of a transistor is formed of a transparent film. For instance, Japanese Patent Application Laid-Open No. 2002-76356 discloses a TFT (thin film transistor) which employs a polycrystalline thin film of a transparent conductive oxide containing ZnO as a main component, for a channel layer.

In addition, an organic electroluminescent light-emitting device has been actively researched and developed. When the organic electroluminescence is applied to a display unit, it is driven in an active matrix fashion in most cases. For the active matrix drive, a TFT which uses amorphous silicon or polysilicon is generally utilized.

In addition, Japanese Patent Application Laid-Open No. H09-114398 discloses an organic electroluminescent display unit which prevents degradation of a driving device, can display a television image, and aims at realizing a high-quality/high-luminance display unit. The organic electroluminescent display unit of an active matrix type according to this patent document is intended to prevent degradation of the driving device while keeping the high image quality, by using two MOS (metal oxide semiconductor) field effect transistors which use single-crystal silicon for an active layer.

In addition, Japanese Patent Application Laid-Open Nos. 2006-165528 and 2006-186319 disclose an example of producing a field effect transistor by using an amorphous oxide which is prepared by adding a specified amount of gallium or the like to a zinc-indium-based oxide to control the electron carrier concentration to less than $10^{18}/cm^3$, and of applying the field effect transistor to an image display apparatus or a light-emitting apparatus.

In the conventional organic light-emitting/display apparatus, since amorphous silicon or polysilicon is used mainly as an active layer (channel layer) of a driving transistor, the gate insulating layer and the interlayer insulating layer can be used with no distinction. Further, since amorphous silicon or polysilicon used for the active layer originally contains hydrogen atoms, the diffusion of hydrogen in the insulating layers has posed no problem in most cases. Hydrogen in an a-SiN:H film produced by a plasma CVD (chemical vapor deposition) process has been rather considered to have an effect of compensating defects in amorphous silicon.

On the other hand, there has been found such a phenomenon that when an oxide semiconductor is used as an active layer of a driving transistor, there is a case where the transistor performs driving without any particular problem and a case where the off-state current increases during driving for a long period of time for unknown reasons. The phenomenon seems to depend on a method of forming an insulating layer which is in contact with an oxide semiconductor active layer, but the reason has not been clarified. Accordingly, there has been a problem that degradation of the characteristics may sometimes be caused due to the phenomenon. Moreover, the degradation of the characteristics has been intensively occurred during active matrix driving for a long period of time.

As described above, the conventional oxide semiconductor has the problem that when used in a stacked device, if a large amount of hydrogen is contained in an insulating layer, the degradation of the characteristics is liable to be occurred due to diffusion of the hydrogen. The problem has remarkably appeared in a display apparatus which employs the oxide semiconductor particularly for an active layer of a TFT. In this case, there has been a problem that a display apparatus cannot be realized which is stably driven for a long period of time and displays an image with high definition and less image defect.

DISCLOSURE OF THE INVENTION

The present invention has been accomplished to dissolve the above described problems, and provides a display apparatus which can be stably driven for a long period of time without degrading the high mobility and high characteristics peculiar to an oxide semiconductor, and can display an image with high definition and less image defect, and a production method of the display apparatus.

In order to achieve the above-mentioned object, according to one aspect of the present invention, there is provided a display apparatus which includes a light-emitting layer, a pair of electrodes sandwiching the light-emitting layer, a transistor with an active layer for driving the light-emitting layer through the pair of the electrodes, and a matrix wiring portion having a scanning electrode line, a signal electrode line, and a first insulating layer, wherein the active layer includes an oxide which contains In and Zn and at least a part of which is amorphous, and wherein a second insulating layer containing hydrogen in an amount of less than $3 \times 10^{21}$ atoms/cm$^3$ is disposed between the active layer and the first insulating layer.

Further, according to another aspect of the present invention, there is provided a method of producing a display apparatus, which includes forming a matrix wiring portion having a scanning electrode line, a first insulating layer and a signal electrode line; forming a transistor with an active layer including an oxide which contains In and Zn and at least a part of which is amorphous; forming a second insulating layer containing hydrogen in an amount of less than $3 \times 10^{21}$ atoms/cm$^3$ between the first insulating layer and the active layer; and forming a light-emitting layer and a pair of electrodes sandwiching the light-emitting layer.

According to the present invention, a display apparatus is provided which can display an image with high definition and less image defect, because a transistor with an active layer which includes an oxide containing In and Zn and at least a part of which is amorphous can stably perform driving for a long period of time. Thereby, the present invention can provide a bottom-emission type display apparatus, a top-emission type display apparatus or a two-sided emission type high-luminance display apparatus which maintains superior stability for a long period of time.

Further features of the present invention will become apparent from the following description of exemplary embodiments with reference to the attached drawings.

BEST MODE FOR CARRYING OUT THE INVENTION

Figure 1:
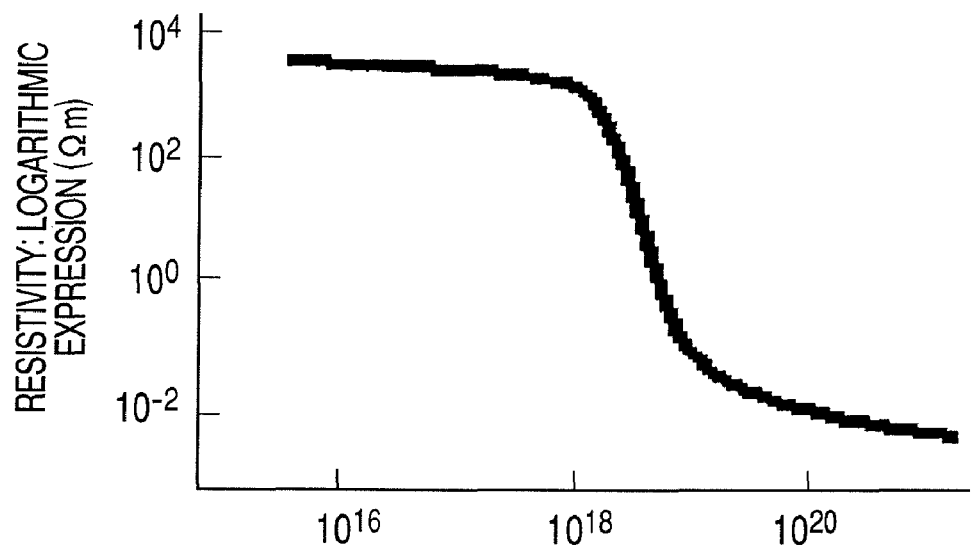
FIG. 1 is a graphical representation illustrating a relationship between the amount of hydrogen ions injected into an In—Ga—Zn—O-based amorphous film and the electrical resistance of the film.

An embodiment of a display apparatus according to the present invention will now be specifically described below with reference to the drawings.

At first, a summary of the present invention will now be described.

The present inventors have energetically carried out a research on an oxide semiconductor active layer, a gate insulating layer, and an interlayer insulating layer of a TFT, and film growth conditions related thereto. As a result, the present inventors have found that a TFT excellent in long-term stability can be obtained by controlling a condition of an oxygen atmosphere during film formation, and controlling the content of hydrogen in the gate insulating layer and the interlayer insulating layer, and then accomplished the present invention.

The present inventors have found that a normally-off type TFT with excellent mobility can be made from an oxide semiconductor active layer having a desired electron carrier concentration and a $Y_2O_3$ insulating layer and can be applied to a light-emitting apparatus, an image display apparatus or the like. Thereafter, it has been confirmed that few elements do not normally operate when subjected to a repetitive light emission test of a long period of time and that in particular, a device with a matrix wiring often shows such tendency.

Further thereafter, the present inventors have found that when an interlayer insulating layer in a matrix wiring portion is a-SiNx:H formed by low temperature plasma CVD, the change in stability is remarkable, and have further made extensive study. As a result, the present inventors have found that by forming an insulating layer having a hydrogen content of less than $3 \times 10^{21}$ atoms/cm$^3$ by using sputtering and then forming an oxide semiconductor active layer of a TFT on the insulating layer, there is obtained an effect of remarkably improving the long-term stability of the TFT. A similar effect can also be obtained by an embodiment in which a portion other than a portion being in a contact with a source electrode and a drain electrode of an oxide semiconductor active layer of a TFT is covered with an insulating layer having the same hydrogen content as described above.

Here, the insulating layer in contact with the oxide semiconductor active layer was formed by controlling the hydrogen content to be less than $3 \times 10^{21}$ atoms/cm$^3$. The insulating layer can be formed by using a sputtering process, but the forming method in the present invention is not limited to sputtering. For instance, the hydrogen content can also be controlled to be less than $3 \times 10^{21}$ atoms/cm$^3$ by forming an amorphous silicon nitride (a-SiNx:H) film by using a low-temperature plasma CVD process and heating the film to 450° C. by using a rapid thermal annealing process. Further, the insulating layer can be made by using a high-temperature plasma CVD process as well.

The present invention has been accomplished based on such findings, and provides a display apparatus using the above described film. Embodiments of the display apparatus according to the present invention will now be described in detail below.

The display apparatus according to the present embodiment includes (1) TFTs; (2) a light-emitting layer; (3) lower and upper electrodes (a pair of electrodes) which sandwich the light-emitting layer; and (4) a matrix wiring portion having a scanning electrode line, a first insulating layer, and a signal electrode line. In this configuration, an active layer of the TFT includes an oxide which contains In and Zn and at least a part of which is amorphous, and a second insulating layer containing hydrogen in an amount of less than $3 \times 10^{21}$ atoms/cm$^3$ is disposed between the active layer and the first insulating layer.

In this configuration, the hydrogen content in the second insulating layer is preferably less than that in the first insulating layer. In addition, of the active layer of the TFT, a portion of the active layer other than a portion being in contact with a source electrode and a drain electrode may be covered with the second insulating layer having the above-mentioned hydrogen content of less than $3 \times 10^{21}$ atoms/cm$^3$. Furthermore, the first insulating layer may have a hydrogen content of less than $3 \times 10^{21}$ atoms/cm$^3$. In addition, the TFTs may be disposed in series on the top of the matrix wiring portion composed of the scanning electrode line, the first insulating layer, and the signal electrode, or disposed in parallel on a part adjacent thereto. Furthermore, the TFTs may be disposed on the top of the matrix wiring portion composed of the scanning electrode line, the first insulating layer, and the signal electrode or on a part adjacent thereto with the second insulating layer formed by a sputtering step being used as a gate insulating layer. The first insulating layer corresponds to the interlayer insulating layer of the matrix wiring portion. The second insulating layer mainly corresponds to a gate insulating layer of the TFT, but is not limited thereto, and may be constituted by an insulating layer wholly covering a portion other than a portion being in contact with a source electrode and a drain electrode of the TFT.

A method of producing a display apparatus according to the present embodiment includes: (1) forming a matrix wiring portion; (2) forming a TFT; (3) forming a second insulating layer; (4) forming a light-emitting layer; and (5) forming a pair of electrodes (lower and upper electrodes) which sandwich the light-emitting layer. The matrix wiring portion has a scanning electrode line, an interlayer insulating layer (a first insulating layer), and a signal electrode line. The TFT has an active layer including an oxide which contains In and Zn and at least a part of which is amorphous. The second insulating layer has a hydrogen content of $3 \times 10^{21}$ atoms/cm$^3$. The pair of the electrodes are the upper and lower electrodes which sandwich the light-emitting layer.

For the display apparatus according to the present embodiment, the following production methods can be adopted.

1) First, a matrix wiring portion is formed which is composed of a scanning electrode line, an interlayer insulating layer, and a signal electrode line. Subsequently, a TFT is formed thereon which has an active layer and a second insulating layer formed by a sputtering step. Then, a lower electrode, a light-emitting layer, and an upper electrode are formed.

2) First, a matrix wiring portion composed of a scanning electrode line, a first insulating layer, and a signal electrode line, and a lower electrode are formed. Subsequently, a TFT having an active layer and a second insulating layer formed by a sputtering step, a light-emitting layer, and an upper electrode are formed.

3) First, a matrix wiring portion is formed which is composed of a scanning electrode line, a first insulating layer, and a signal electrode line. Subsequently, a TFT having a portion of an active layer other than a source electrode and a drain electrode covered with a second insulating layer formed by a sputtering step, a light-emitting layer, a lower electrode, and an upper electrode are formed.

4) First, a matrix wiring portion composed of a scanning electrode line, a first insulating layer, and a signal electrode line, and a lower electrode are formed. Subsequently, a TFT having a portion of an active layer other than a source electrode and a drain electrode covered with a second insulating layer formed by a sputtering step, a light-emitting layer, and an upper electrode are formed.

A display apparatus according to the present embodiment will now be described below in detail with particular focus on an oxide semiconductor active layer and the second insulating layer having the hydrogen content of less than $3 \times 10^{21}$ atoms/cm$^3$.

(Transparent Amorphous Oxide Film)

First, as an oxide semiconductor active layer, a transparent amorphous oxide film containing electron carriers in a concentration of less than $10^{18}$/cm$^3$ according to the present inventors will be described.

The above-mentioned transparent amorphous oxide film is specifically constituted by including In—Ga—Zn—O and has a composition represented by InGaO$_3$(ZnO)$_m$, wherein m is a natural number of less than 6, in a crystal state, and has an electron carrier concentration of less than $10^{18}$/cm$^3$. It is also preferred to control the electron mobility in this film to be 1 cm$^2$/(V·sec) or more.

When the above-mentioned film is used in a channel layer (active layer) of a TFT, a TFT can be produced which is of a normally off type in which the gate current is less than 0.1 μA when the transistor is in an off state, has transistor characteristics of an ON/OFF ratio exceeding $10^3$, and is transparent to visible light and flexible. In addition, the electron mobility of the above-mentioned transparent amorphous oxide film increases with increase of the number of conduction electrons. As a substrate for formation of the transparent amorphous oxide film, there may be used a metal substrate, a metal thin plate, a glass substrate, a plastic substrate, or a plastic film.

The present inventors have found that such a transparent amorphous oxide film has specific characteristics in which the electron mobility increases as the number of conduction electrons increases. Further, they have also found that a TFT formed by using the film has further improved transistor characteristics such as an ON/OFF ratio, a saturation current in a pinched-off state and a switching speed.

When using the transparent amorphous oxide film for a channel layer of a thin film transistor, it is preferable to control the electron mobility to be 1 cm$^2$/(V·sec) or more and also to control the electron carrier concentration to be less than $10^{18}$/cm$^3$. It is further preferable to control the electron mobility to be 5 cm$^2$/(V·sec) or more and to control the electron carrier concentration to be less than $10^{16}$/cm$^3$. By respectively controlling the electron mobility and the electron carrier concentration within the above-mentioned ranges, the electric current flowing between the drain and source terminals in an off-state (when a gate voltage is not applied) can be made less than 10 μA, preferably less than 0.1 μA.

By using the thin film, when the electron mobility is 1 cm$^2$/(V·sec) or more and preferably 5 cm$^2$/(V·sec) or more, the saturation current after pinch-off can be made more than 10 μA. Further, the ON/OFF ratio can be made 10 or more. In the TFT in a pinched-off state, a high voltage is applied to the gate terminal, and electrons exist in the channel at a high density.

Thus, according to the present invention, the saturation current value can be increased by an amount corresponding to the increase of the electron mobility. As a result, almost all the transistor characteristics are improved including ON/OFF ratio increase, saturation current increase, and switching speed increase. Incidentally, in a normal compound, when the number of electrons increases, the electron mobility decreases because electrons collide with each other.

As the structure of the above described TFT, a staggered (top gate) structure can be adopted in which a gate insulating film and a gate terminal are sequentially formed on a semiconductor channel layer. Furthermore, an inverted staggered (bottom gate) structure can also be adopted in which a gate insulating film and a semiconductor channel layer are sequentially formed on a gate terminal.

(Film Composition)

In a transparent amorphous oxide thin film having a composition represented by InGaO$_3$(ZnO)$_m$ (wherein m is a natural number of less than 6) in a crystal state, when the value of m is less than 6, the amorphous state is stably kept up to a high temperature of 800° C. or more. However, as the value of m increases, the ratio of ZnO to InGaO$_3$ increases, i.e., the composition approaches to a ZnO composition, the film becomes liable to be crystallized. Accordingly, when the film is used for a channel layer of an amorphous TFT, the value of m is preferably less than 6.

(Implantation of Hydrogen Ions into Transparent Amorphous Oxide Film)

An amorphous oxide of In—Ga—Zn was prepared by using a sputter evaporation process while using a polycrystal sintered body having a composition of $InGaO_3(ZnO)_m$ (wherein m is a natural number of less than 6) as a target and also using argon gas and oxygen gas as an atmospheric gas. The film formation was performed while controlling the substrate temperature to room temperature, setting the sputtering pressure to 0.48 Pa and setting the oxygen gas ratio to 5%. Hydrogen ions were implanted into the resulting deposited film of the transparent amorphous oxide (a-InGaZn:O), and the change of resistivity (Ωm) depending on the implantation amount ($1/cm^3$) of hydrogen ions was observed. The result is shown in FIG. 1.

It can be seen from the result shown in FIG. 1 that the resistivity of the transparent amorphous oxide film changes by 4 to 5 digits in the vicinity of a hydrogen ion implantation amount of $10^{19}/cm^3$, and the resistance of the film decreases as the hydrogen ion implantation amount increases. This reveals the effect of hydrogen ions implanted into the transparent amorphous oxide (a-InGaZn:O) film. However, the value of hydrogen ion implantation amount of $10^{19}/cm^3$ is not a fixed value, and the hydrogen ion implantation amount at which the resistivity changes will vary depending on the preparation conditions or method.

(Hydrogen Atom Concentration in Insulating Layer)

Figure 2:
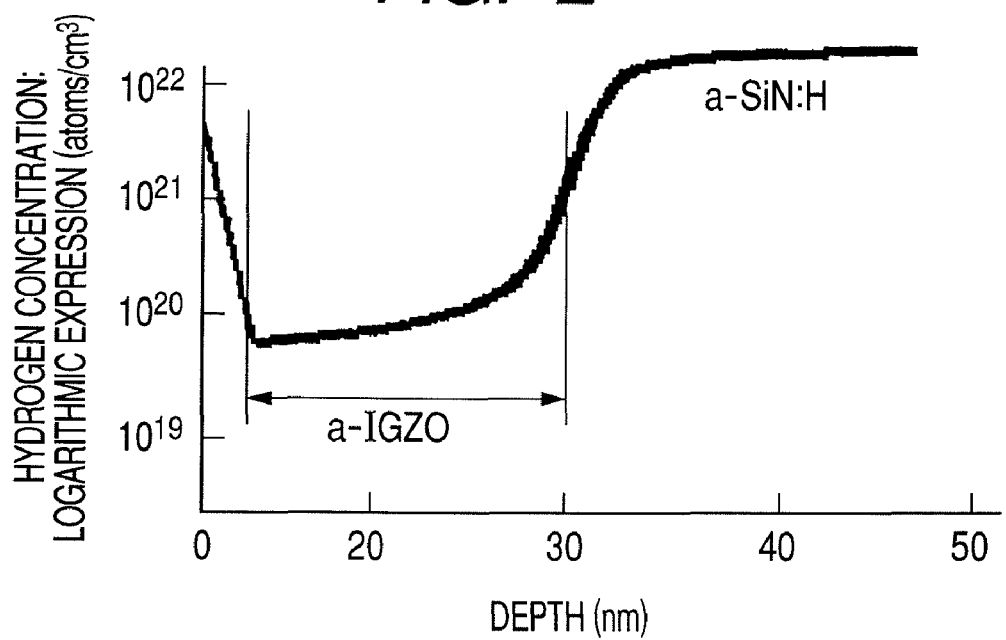
FIG. 2 is a graphical representation illustrating a distributed state of hydrogen atoms contained in an insulating layer, which have diffused into an In—Ga—Zn—O-based amorphous film.

The concentrations of hydrogen atoms contained in a-SiN:H, a-SiN$_x$, a-SiO$_x$:H, and a-SiO$_x$ prepared by a plasma-CVD process or a sputtering process was measured with an SIMS (Secondary Ion Mass Spectrometry) measurement equipment. The result is shown in FIG. 2. It can be seen from the result shown in FIG. 2 that the concentration of hydrogen atoms in an a-SiN:H film produced by a plasma-CVD process is $1 \times 10^{22}$ atoms/cm$^3$, and that hydrogen atoms diffuse from inside of the a-SiN:H film into an a-InGaZn:O film.

Figure 3:
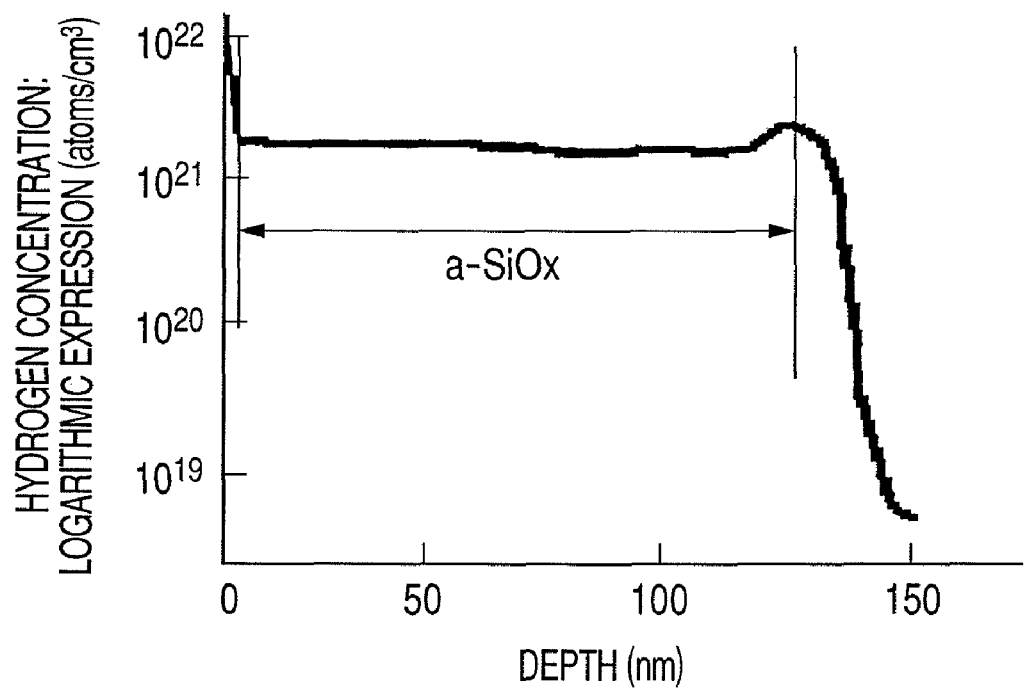
FIG. 3 is a graphical representation illustrating a concentration of hydrogen atoms in an insulating layer according to the present invention.

Similarly, the concentration of hydrogen atoms in the insulating layer produced by a sputtering step was measured. The result is shown in FIG. 3. It can be seen from the result that the concentration of hydrogen atoms in the insulating layer (a-SiO$_x$) prepared by the sputtering process is less than $3 \times 10^{21}$ atoms/cm$^3$.

It has been confirmed from the measurement result that the concentration of hydrogen atoms in an insulating layer can be reduced by the preparation conditions or method.

(Dependency of TFT Characteristics on Amount of Hydrogen Atoms in Gate Insulating Layer)

Figure 4:
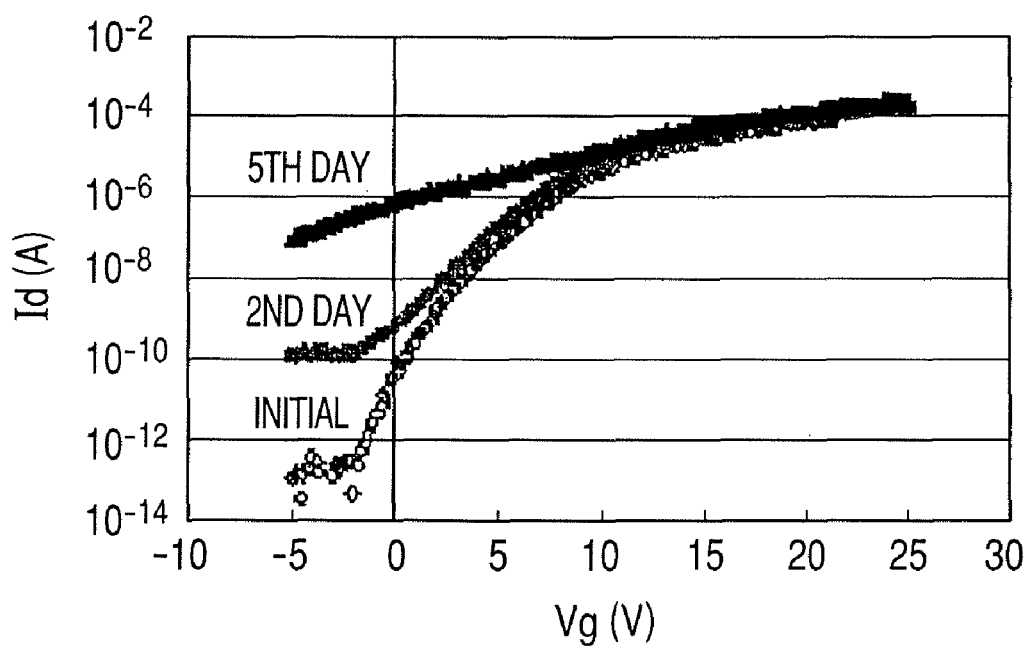
FIG. 4 is a graphical representation illustrating Id-Vg characteristics of a TFT using a gate insulating layer containing a large amount of hydrogen.

The change over time of a TFT including a gate insulating layer containing a large amount of hydrogen atoms (hydrogen atom concentration: $1 \times 10^{22}$ atoms/cm$^3$) was compared in terms of Id-Vg characteristics. The result is shown in FIG. 4. It can be seen from the result that the off-state current increases with the elapse of time and finally a state in which the TFT cannot turn on/off is reached.

Figure 5:
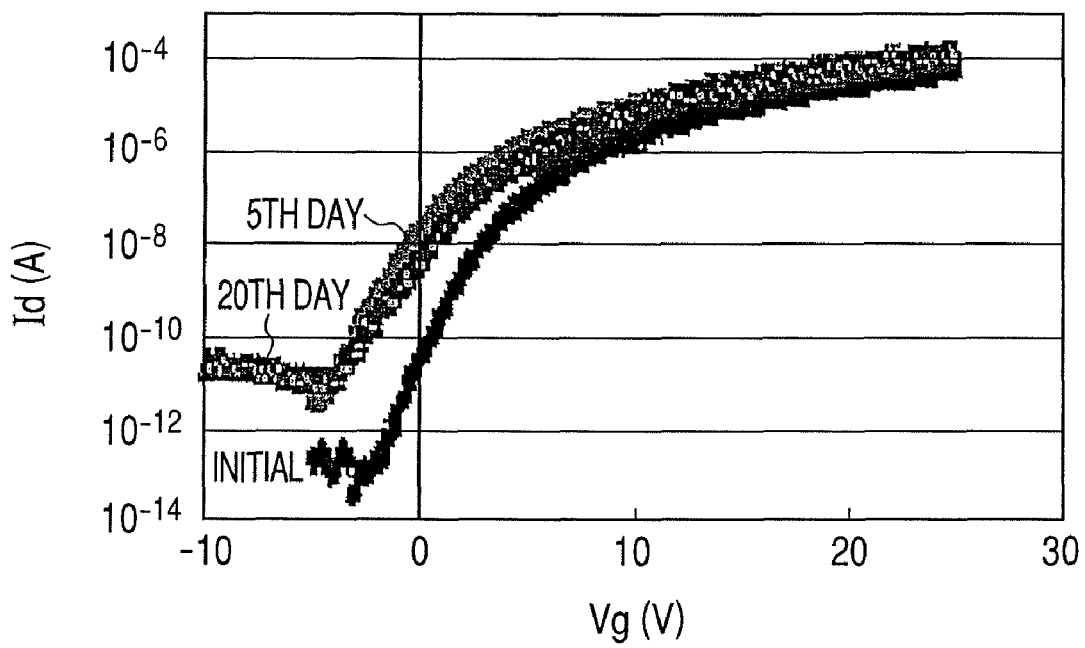
FIG. 5 is a graphical representation illustrating Id-Vg characteristics of a TFT using a gate insulating layer containing a small amount of hydrogen according to the present invention.

On the other hand, FIG. 5 shows a change over time of a TFT using a gate insulating layer containing a small amount of hydrogen atoms (hydrogen content: less than $3 \times 10^{21}$ atoms/cm$^3$). In this case, little change was observed, and good characteristics were maintained.

Figure 6:
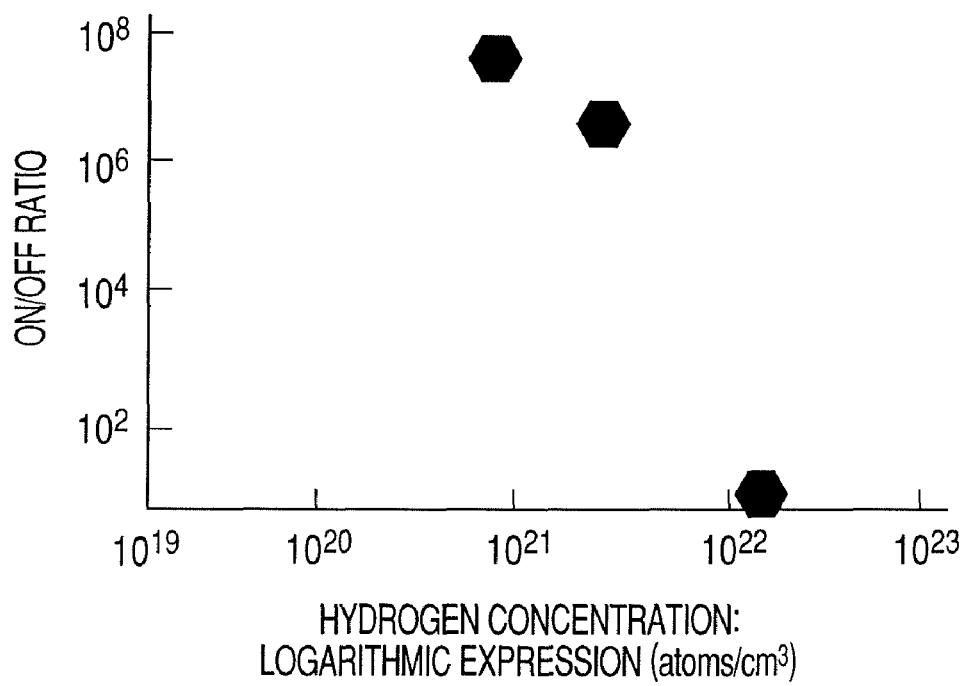
FIG. 6 is a graphical representation illustrating a relationship between a concentration of hydrogen atoms in a gate insulating layer according to the present invention and an ON/OFF ratio in TFT characteristics.

In addition, FIG. 6 shows a relationship between the concentration of hydrogen atoms in the gate insulating layer and an ON/OFF ratio of TFT characteristics at the time of 20 days after the preparation. The results mean that the TFT shows better characteristics when containing the hydrogen atom concentration to at least less than $3 \times 10^{21}$ atoms/cm$^3$. This is considered to be because the resistance of the oxide semiconductor decreased due to the diffusion of hydrogen into the oxide semiconductor layer and a high ON/OFF ratio was not able to be attained, as is seen from the above described results.

As described above, SiO$_x$ or SiN$_x$ is preferable for the gate insulating layer to be used in a thin film transistor using a transparent amorphous oxide film. However, it can be seen that in order to maintain the stability for a long period of time, it is indispensable to set the hydrogen content in the insulating layer to be less than $3 \times 10^{21}$ atoms/cm$^3$, and that in the case of a film having a large hydrogen content, the characteristics change with the elapse of time and the off-state current increases. Moreover, it is easily assumed that the same also applies to the contents of hydrogen in other insulating layers such as of Al$_2$O$_3$, Y$_2$O$_3$, or HfO$_2$ film. According to the findings of the present inventors, the effect of the present invention is obtained as long as the hydrogen content in the insulating layer is less than $3 \times 10^{21}$ atoms/cm$^3$, so that there is no lower limit in the hydrogen content in particular. Accordingly, the lower limit of the hydrogen content in the insulating layer is ideally zero.

In addition, when there is a defect in an interface between a gate insulating thin film and a channel layer thin film, the electron mobility decreases and a hysteresis is generated in the transistor characteristics.

In addition, a leak current greatly differs depending on the type of a gate insulating film. Accordingly, a gate insulating film needs to be selected so as to match a channel layer.

In addition, the gate insulating film and the channel layer can be formed at room temperature, so that any TFT structure of a staggered structure and an inverted staggered structure can be formed.

The TFT is a three-terminal device having a gate terminal, a source terminal, and a drain terminal, and employs a semiconductor thin film formed on an insulation substrate such as of ceramic, glass or plastic as a channel layer through which electrons or holes move. Moreover, the TFT is also an active device which has a function of, in operation, applying a voltage to the gate terminal to control an electric current flowing in the channel layer, thereby switching an electric current between the source terminal and the drain terminal.

In the next place, a display apparatus according to an embodiment of the present invention will be specifically described.

The present embodiment relates to a display apparatus using the above described transparent amorphous oxide film. Specifically, the embodiment relates to a display apparatus driven by TFTs each using a semiconductor which is the above described transparent amorphous oxide film, and in particular, relates to a light source and a display unit for emitting light by driving an organic EL device. Thereby, the present embodiment can provide a display apparatus using a substrate even made of a plastic or the like which is lightweight and is hardly cracked.

In the next place, a basic configuration of a display apparatus according to the present embodiment will be described with reference to FIGS. 7A, 7B and 7C.

In the figures, reference numeral 400 denotes a substrate, reference numeral 401 denotes a power supply line, reference numeral 402 denotes a GND (grounding) line, reference numeral 403 denotes a signal electrode line, reference numeral 404 denotes a first insulating layer (interlayer insulating layer), and reference numeral 405 denotes a contact electrode embedded in each contact hole. In addition, reference numeral 406 denotes a gate electrode, reference numeral 407 denotes a scanning electrode line, reference numeral 408 denotes a second insulating layer, reference numeral 409 denotes an amorphous oxide semiconductor, reference numeral 410 denotes a source electrode and a drain electrode, reference numeral 411 denotes a lower electrode, reference numeral 412 denotes a third insulating layer, reference numeral 413 denotes a light-emitting layer, and reference numeral 414 denotes an upper electrode. Among them, the second insulating layer 408 and the third insulating layer 412 together constitute the second insulating layer according to the present invention.

At first, the power supply line 401, the GND line 402, and the signal electrode line 403 are patterned on the substrate 400, and subsequently the first insulating layer 404 is deposited, contact holes are formed at desired positions of the first insulating layer 404, and the contact electrodes 405 are further embedded at the desired positions.

Next, the gate electrode 406 and the scanning electrode line 407 are patterned on the first insulating layer 404. At this time, the gate electrodes 406 are disposed in desired positions according to the necessary number of transistors, and electrodes (not shown) for the necessary number of capacitors are also patterned. Thus, it is one of the key features of the present invention to form a matrix wiring portion before forming a transistor.

Subsequently, the second insulating layer 408 having a hydrogen content of less than $3\times10^{21}$ atoms/cm$^3$ is formed by a sputtering step. Furthermore, contact holes are formed at desired positions of the second insulating layer 408, and contact electrodes are embedded in the contact holes.

Next, the lower electrode 411 of the light-emitting portion is formed so as to be connected to the power supply line 401 through the contact electrode 405, and an amorphous oxide semiconductor 409 is patterned on the second insulating layer 408. Subsequently, a source electrode and a drain electrode 410 are formed, and one of the electrodes is connected to a GND line 402 through the contact electrode.

Next, in order to protect the channel portion of the transistor, the third insulating layer 412 having a hydrogen content of less than $3\times10^{21}$ atoms/cm$^3$ is formed by a sputtering step. Subsequently, a light-emitting layer 413 composed of a hole-transporting layer, a light-emitting portion and an electron-transporting layer (not shown) is formed on the lower electrode 411. Subsequently, the upper electrode 414 is deposited on the light-emitting layer 413, and the upper electrode 414 is connected to the other electrode of the source electrode and the drain electrode 410.

The light-emitting layer 413 is not limited to the above described configuration. Further, when the TFT is in an ON state, a voltage is applied to the light-emitting layer 413 to emit light. As the upper electrode 414, a metal electrode is used when the light-emitting device is used as a bottom emission type device, and a transparent electrode may be used when the light-emitting device is used as a two-sided emission type device. The material can be changed according to the intended use of the light-emitting device.

In the next place, each component of a display apparatus used in the present embodiment will be described in detail.

1. Substrate

A glass substrate is generally used in a image display apparatus. However, in principle, a substrate to be used in the present invention is not particularly limited as long as it has flatness. Since the TFT used in the present invention can be formed at a low temperature, a plastic substrate, which is generally hard to be used for an active matrix type display apparatus, can be used. Thereby, an image display apparatus is obtained which is lightweight and is hardly broken. The image display apparatus can be bent to a certain extent.

In addition to the glass substrate and the plastic substrate, a semiconductor substrate such as of Si or a ceramic substrate can also be used. In addition, a substrate having an insulating layer provided on a metal substrate can be used as long as it is flat.

2. Transistor

As the active layer, an In—Ga—Zn—O-based semiconductor is used. For this composition, substitution with or addition of an element such as Mg can be performed as long as the semiconductor has desired characteristics, that is, the electron carrier concentration is less than $10^{18}$/cm$^3$ and the electron mobility is more than 1 cm$^2$/(V·sec).

As described above, a sputtering process or a pulsed laser evaporation process is suitable for forming the active layer, but various sputtering processes which are advantageous in productivity are more preferable. In addition, it is effective to appropriately insert a buffer layer between the active layer and a substrate.

For the gate insulating film, there are preferably used $Al_2O_3$, $Y_2O_3$, $HfO_2$, $SiO_x$, and $SiN_x$ as described above. However, in order to maintain the long-term stability, it is indispensable that the hydrogen content in the insulating layer is less than $3\times10^{21}$ atoms/cm$^3$.

3. Lower Electrode

When the light-emitting layer is of a current injection type represented by an organic electroluminescent device, a preferred electrode is adopted according to the configuration thereof. For instance, when the lower electrode is connected as an anode to the light-emitting layer, the lower electrode is preferably a transparent electrode having a large work function. Examples of such material include ITO, electroconductive ZnO or In—Zn—O having an electron carrier concentration of $10^{18}$/cm$^3$ or more. Alternatively, In—Ga—Zn—O-based oxide having an electron carrier concentration of $10^{18}$/cm$^3$ or more can be used as well. In this case, in contrast to the case of a TFT, a larger carrier concentration, for instance, $10^{19}$/cm$^3$ or more is more preferable.

4. Light-Emitting Layer

The light-emitting layer is not particularly limited as long as it can be driven by an In—Ga—Zn—O-based TFT, but is preferably an organic electroluminescent layer in particular.

The light-emitting layer used in the present invention is generally composed of a plurality of layers such as (1) hole-transporting layer/(light-emitting portion+electron-transporting layer) (meaning a light-emitting portion having an electron-transporting function);

(2) hole-transporting layer/light-emitting portion/electron-transporting layer;

(3) hole injection layer/hole-transporting layer/light-emitting portion/electron-transporting layer; (4) hole injection layer/hole-transporting layer/light-emitting portion/electron-transporting layer/electron injection layer.

In addition, there are cases where an electron barrier layer or an adhesion improving layer is additionally provided. Among the above examples, a representative light-emitting layer is composed of hole-transporting layer/light-emitting section/electron-transporting layer. Incidentally, the light-emitting layer according to the present invention is not limited to these configurations.

For the light-emitting layer, fluorescence and phosphorescence are utilized, but it is effective to utilize the phosphorescence from the viewpoint of emission efficiency. As the phosphorescent material, an iridium complex is useful. Further, as the compound used, both a low molecular compound and a high molecular compound are available. In general, the low molecular compound can be formed into a film by vapor deposition, and the high molecular compound can be formed into a film by ink jet or printing. Examples of the low molecular compound include an amine complex, an anthracene, a rare earth complex, and a noble metal complex. Examples of the high molecular compound include π-conjugated or pigment-containing polymers.

As the material of the electron injection layer, there are included an alkali metal, an alkaline earth metal and a compound thereof; and an organic layer doped with an alkali metal.

Further, as the material of the electron-transporting layer, there are included an aluminium complex, oxadiazole, triazole, and phenanthroline.

Moreover, as the material of the hole injection layer includes an arylamine, a phthalocyanine, and an organic layer doped with a Lewis acid.

Furthermore, as the material of the hole-transporting layer, an arylamine is included.

5. Upper Electrode

The preferred material of the upper electrode varies depending on whether the light emitting device is used as a two-sided emission type or a bottom emission type, and whether the upper electrode is used an anode or a cathode.

When used as the two-sided emission type, the upper electrode needs to be transparent. Examples of the material of the transparent electrode includes oxides such as electroconductive ZnO, In—Zn—O, or ITO, which contains at least one element of In and Zn, is formed under deposition conditions including an oxygen flow rate adjusted such that the electron carrier concentration is $10^{18}/cm^3$ or more, and at least a part of which is amorphous. Alternatively, an In—Ga—Zn—O-based oxide having an electron carrier concentration of $10^{18}/cm^3$ or more can be used. Moreover, the upper electrode can be prepared by forming an alloy doped with an alkali metal or an alkaline earth metal into a film of several 10 nm or less in thickness and forming a transparent electrode thereon.

In the case of the bottom emission type, the upper electrode does not need to be transparent. Accordingly, when the upper electrode is used as the anode, the usable material includes an Au alloy or a Pt alloy having a large work function, and when used as the cathode, the usable material includes Ag-added Mg, Li-added Al, a silicide, a boride, and a nitride.

In the present embodiment, a matrix wiring portion is formed beforehand (in which an interlayer insulating film used is normally a-SiOx:H, a-SiNx:H, a-SiNOx:H or the like produced by a PCVD (Plasma Chemical Vapor Deposition) process). Subsequently, an insulating layer is separately formed by using a method which is difficult to incorporate hydrogen into the insulating layer, and then an oxide semiconductor layer is formed and a pixel circuit is produced. As described above, the display apparatus according to the present embodiment uses a TFT formed of or protected by the insulating layer having the small hydrogen content, and therefore can solve the problem that in the case where a conventional oxide semiconductor is used for a stacked device, when an insulating layer contains much hydrogen, the characteristics of the device are liable to be degraded due to the diffusion of the hydrogen. Thereby, the present invention can provide a display apparatus which does not degrade the high mobility and excellent characteristics peculiar to the oxide semiconductor and is stably operated.

APPLICATION EXAMPLE

A configuration example in which the above described embodiment is applied to a display apparatus having a plurality of matrix wirings will now be described with reference to FIG. 8.

In the figure, reference numeral 55 denotes a selecting transistor which selects a pixel, and reference numeral 56 denotes a driving transistor which drives a light-emitting layer 58. In addition, a capacitor 57 is provided for keeping a selected state, stores an electric charge between a GND line 53 and a source electrode of the selecting transistor 55, and holds a signal of a gate of the driving transistor 56. The pixel is selected by a scanning electrode line 51 and a signal electrode line 52.

Specifically, the operation will now be described. An image signal from a driver circuit (not shown) is applied to a gate electrode in a form of a pulse signal through the scanning electrode line 51. At the same time, another pulse signal from another driver circuit (not shown) is applied to the selecting transistor 55 through the signal electrode line 52, whereby a pixel is selected. At that time, the selecting transistor 55 is turned on, and an electric charge is stored in the capacitor 57 provided between the GND line 53 and the source of the selecting transistor 55. Thereby, a gate voltage of the driving transistor 56 is kept at a desired voltage, and the driving transistor 56 is turned on. This state is maintained until a next signal is received. While the driving transistor 56 is in the ON state, a voltage and an electric current continue to be supplied to the light-emitting layer 58 to continue light emission.

Figure 8:
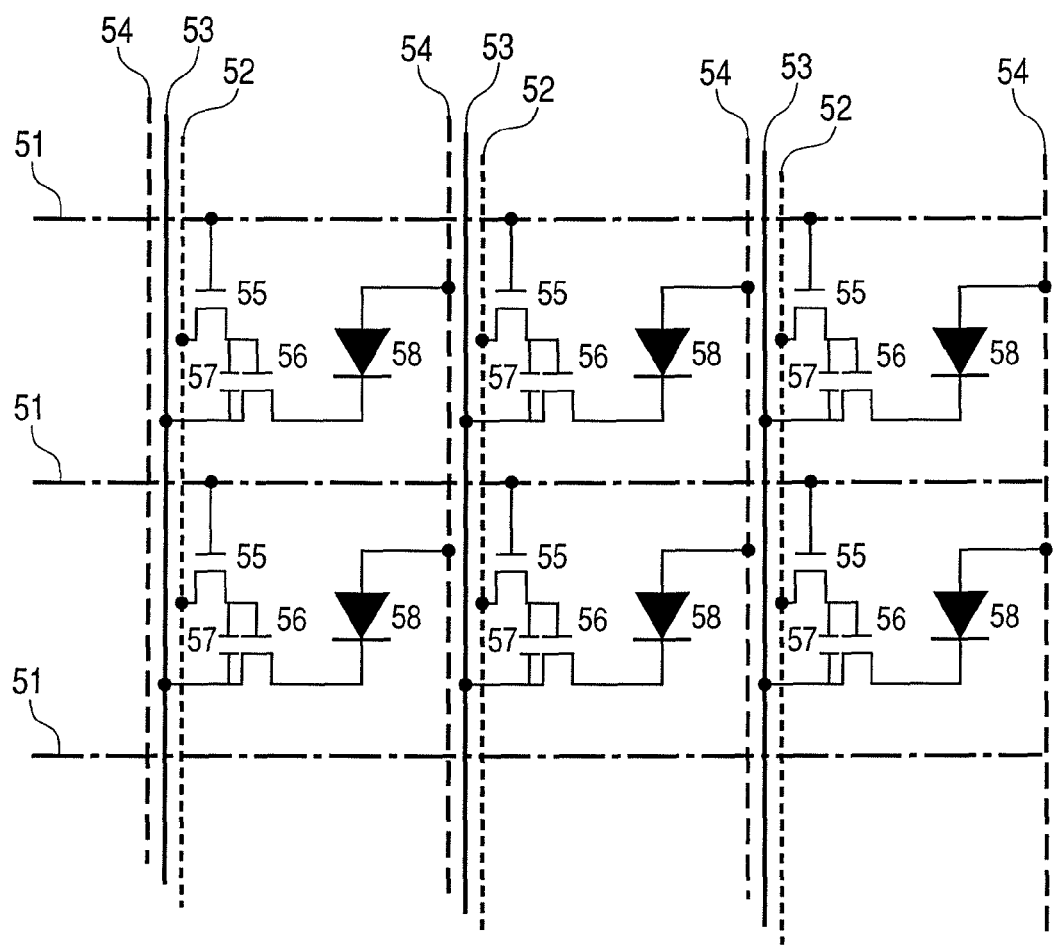
FIG. 8 is a circuit diagram of a display apparatus having a plurality of matrix lines according to an embodiment of the present invention.

The example illustrated in FIG. 8 has the configuration in which one pixel has two transistors and one capacitor, but one pixel may have a larger number of transistors integrated therein in order to improve the performance. It is sufficient that an amorphous oxide semiconductor containing at least In and Zn is used in the portion of an active layer of a transistor and an insulating layer having a hydrogen content of less than $3 \times 10^{21}$ atoms/$cm^3$. Further, it is preferred that a matrix wiring portion such as a scanning electrode line, a signal electrode line, and a power supply line is formed prior to the formation of the transistor portion. Thereby, an image display apparatus can be obtained which is excellent in long-term repetition characteristics.

ANOTHER EMBODIMENT

In the next place, a basic configuration of a display apparatus according to another embodiment of the present invention will be described with reference to FIGS. 9A and 9B.

In the figure, reference numeral 600 denotes a substrate, reference numeral 601 denotes a lower electrode, reference numeral 602 denotes a power supply line, reference numeral 603 denotes a signal electrode line, reference numeral 604 denotes a GND line, and reference numeral 605 denotes a first insulating layer (interlayer insulating layer). In addition, reference numeral 606 denotes a gate electrode, reference numeral 607 denotes a second insulating layer, reference numeral 608 denotes an amorphous oxide semiconductor, reference numeral 609 denotes a source electrode and a drain electrode, reference numeral 610 denotes a third insulating layer, reference numeral 611 denotes a bank, reference numeral 612 denotes a light-emitting layer, and reference numeral 613 denotes an upper electrode. Among the above-mentioned elements, the second insulating layer 607 and the third insulating layer 610 together constitute the second insulating layer according to the present invention.

In the figure, at first, the lower electrode 601 of the light-emitting layer 612 is patterned on the substrate 600. Furthermore, after a metal layer is deposited, the power supply line 602, the signal electrode line 603, and the GND line 604 are also patterned. At this time, the power supply line 602 is patterned so as to be in contact with the lower electrode 601.

Subsequently, after the first insulating layer 605 is deposited and patterned, contact holes are formed at desired positions of the first insulating layer 605, and then contact electrodes are embedded in the contact holes. Subsequently, the gate electrode 606 and a scanning electrode line (not shown) are patterned at desired positions on the first insulating layer 605. At this time, the gate electrodes 606 are disposed corresponding to the necessary number of transistors, and electrodes (not shown) for the necessary number of capacitors are also patterned. As described above, it is also one of the key features of the present invention that the matrix wiring portion is formed before the formation of the transistor.

Next, the second insulating layer 607 having a hydrogen content of less than $3\times10^{21}$ atoms/cm$^3$ is formed thereon. Furthermore, a contact hole is formed at a desired position of the second insulating layer 607, and a contact electrode is embedded in the contact hole. In addition, an amorphous oxide semiconductor 608 which becomes an active layer of the transistor is patterned on the second insulating layer 607. Subsequently, the source electrode and drain electrode 609 are formed, and one of the electrodes is connected to the GND line 604 through the contact electrode. Next, the third insulating layer 610 having a hydrogen content of less than $3\times10^{21}$ atoms/cm$^3$ is formed thereon with a sputtering step so as to protect the channel portion of the transistor. Subsequently, on the lower electrode 601, the light-emitting layer 612 is formed which is composed of a hole-transporting layer, a light-emitting portion, an electron-transporting layer and the like (not shown). Subsequently, the upper electrode 613 is deposited, and the thus formed upper electrode 613 is connected to the other of the source electrode and drain electrode 609.

Incidentally, the light-emitting layer 612 is not limited to the above described configuration. Further, when the TFT is in an ON state, a voltage is applied to the light-emitting layer 612 to emit light. As the upper electrode 613, a metal electrode is used when the light-emitting device is used as a bottom emission type device, and a transparent electrode may be used when the light-emitting device is used as a two-sided emission type device. The material can be changed according to the intended use of the light-emitting device.

A display apparatus according to the present invention and a production method thereof will now be described in detail below.

Example 1

In the first place, Example 1 according to the present invention will now be described.

At first, a SiO$_2$ glass substrate (1737 manufactured by Corning, Inc.) was prepared as a substrate for film formation. As the pretreatment before film formation, the substrate was ultrasonically degreased and cleaned with acetone, IPA (isopropanol), and ultrapure water sequentially for five minutes each and then dried at 100° C. in air.

Subsequently, a film with a thickness of 200 nm was deposited by a DC (direct current) sputtering process using Al—Si (5%) as a target material, and then a power supply line, a GND line, and a signal electrode line were patterned at desired positions by using a photolithographic process and a dry process.

Next, a film of a-SiNx:H was deposited thereon as an interlayer insulating layer in a thickness of 600 nm at a substrate temperature of 300° C. using a plasma-CVD process. Subsequently, contact holes were formed in desired positions, and electrodes were embedded so as to contact the power supply line, the GND line, and the signal electrode line. Furthermore, films of Ti/Au/Ti were deposited in thicknesses of 5 nm/40 nm/5 nm respectively with a DC sputtering process using Au and Ti as target materials. Thereafter, a scanning electrode line, two gate electrodes for TFT and an electrode for a capacitor were formed at desired positions with a photolithographic process and a lift-off process.

Thus, a matrix wiring portion was formed on the substrate, and then the gate electrode for the TFT and the electrode for the capacitor were formed thereon.

Next, a second insulating layer having a hydrogen content of less than $3\times10^{21}$ atoms/cm$^3$ was formed on the substrate having the matrix wiring portion formed thereon. A sintered body (with a size of 98 mm in diameter and 5 mm in thickness) having a composition of SiO$_2$ was used for the target material. A deposition chamber was controlled to reach a vacuum degree of $2.0\times10^{-4}$ Pa. In the deposition chamber, Ar gas was flown at 133 Pa for 20 minutes before the film formation, and pre-sputtering was performed for five minutes. During the film formation, the total pressure in the chamber was controlled to a constant value of 0.1 Pa, Ar gas was flown at 10 sccm, and the distance between the target and the film-forming substrate was set at 75 mm. The input power was RF 400 W, and the film forming rate was 7 nm/min. The deposited film thickness of the second insulating layer was 200 nm. Furthermore, contact holes were formed in the second insulating layer with a dry etching process. The dry etching was performed under the conditions of CF$_4$ gas 20 sccm, 5 Pa, and RF 150 W at an etch rate of 41 nm/min for 5.5 minutes.

Next, an amorphous oxide semiconductor was formed as the active layer of the TFT. A polycrystal sintered body (with a size of 98 mm in diameter and 5 mm in thickness) having the composition of InGaO$_3$(ZnO)$_4$ was used for the target material. The sintered body was prepared by wet mixing In$_2$O$_3$, Ga$_2$O$_3$ and ZnO (each 4N reagent) as starting materials (solvent: ethanol), followed by presintering (1,000° C.; 2 hours), dry milling, and sintering (1,500° C.; 2 hours). The target had an electrical conductivity of 12 S/cm and was in a semi-insulating state. The vacuum reached in the deposition chamber was $3.0\times10^{-4}$ Pa. During the film formation, the total pressure in the deposition chamber was controlled to a constant value of 0.5 Pa, and the oxygen gas ratio was controlled to 5%. In addition, the distance between the target and the film-forming substrate was set at 75 mm. The input power was RF 200 W, and the film-forming rate was set at 7.1 nm/min. The deposited film thickness of the amorphous oxide semiconductor was 40 nm. Furthermore, wet etching was performed by using an aqueous hydrochloric acid solution (HCl:water=1:10) to pattern the amorphous In—Ga—Zn—O.

Next, a source electrode and a drain electrode of a TFT and a lower electrode of a light-emitting layer were prepared. A sintered body (with a size of 98 mm in diameter and 5 mm in thickness) having a composition of ITO (Sn: 5%) was used as a target material. The vacuum reached in the deposition chamber was $3.0\times10^{-4}$ Pa. During the film formation, the total pressure in the deposition chamber was controlled to the constant value of 0.3 Pa, Ar gas was flown at 10 sccm, and the distance between the target and the film-forming substrate was set at 75 mm. The input electric power was RF 300 W, and the film-forming rate was set at 60 nm/min. The film thickness was 100 nm. The source electrode, the drain electrode, and the lower electrode of the light-emitting layer were formed by patterning at desired positions with a photolithographic process and a lift-off process.

Next, on the amorphous oxide semiconductor, a film of SiO$_x$ with a thickness of 200 nm was stacked using a sputtering process by following the same procedure as the formation of the second insulating layer, and a third insulating layer was formed by patterning at desired positions by means of a photolithographic process and a lift-off process.

Subsequently, a light-emitting layer was formed on the lower electrode for the light-emitting layer. A hole injection layer was formed of 4,4'-bis[N,N-diamino]-4''-phenyl-triphenylamine in a thickness of 45 nm by using a resistive evaporation process. Then, a film of 4,4'-bis[N-(1-naphthyl)-N-phenylamino]biphenyl was formed thereon in a thickness of 25 nm as a hole-transporting layer. Subsequently, a film of 4,4'-bis(2,2'-diphenyl vinyl)-1,1'-biphenyl as a light-emitting layer was formed thereon in a thickness of 30 nm and a film of tris(8-quinolinol) aluminum as an electron-transporting layer was further formed thereon in a thickness of 15 nm, thus completing an organic EL light-emitting layer as a whole.

Furthermore, an upper electrode of the light-emitting layer was prepared by forming a film of an alloy of Al and Ag in a thickness of 50 nm with a resistive heating evaporation process, and forming an Al film thereon in a thickness of 200 nm. The upper electrode was connected to the drain electrode of the TFT.

Figure 7A:
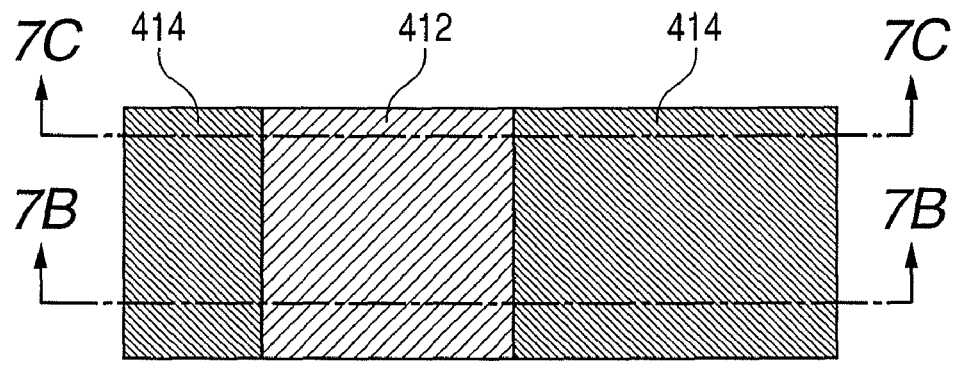
FIG. 7A is a plan view of a representative pixel portion used in a display apparatus according to an embodiment of the present invention.
Figure 7B:
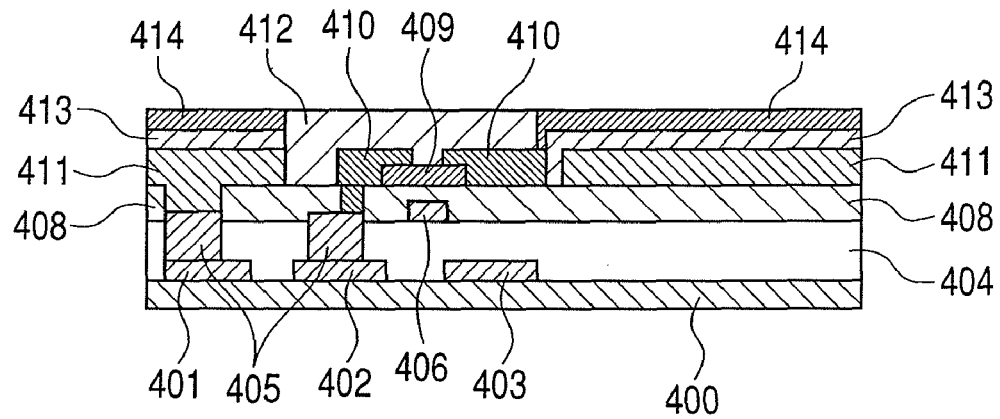
FIG. 7B is a cross-sectional view taken along line 7B-7B in FIG. 7A.
Figure 7C:
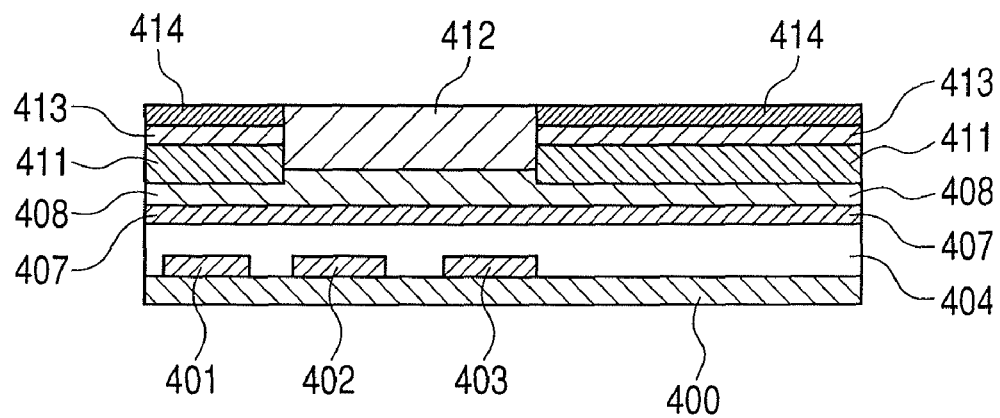
FIG. 7C is a cross-sectional view taken along line 7C-7C in FIG. 7A.

Thereafter, the substrate having the films stacked thereon was sealed with a glass cap containing a desiccant (not shown), whereby a display apparatus having basically the same configuration as that shown in FIGS. 7A to 7C was produced.

When a desired voltage and signal was given to each of the power supply line, the GND line, the signal electrode line, and the scanning electrode line of the above described device to thereby drive the TFTs, a blue light was emitted from the lower surface of the substrate, i.e., in a bottom emission type. In addition, when the TFTs were driven 1,000,000 times, there was not observed any special abnormality in light emission.

Comparative Example 1

As the present comparative example, a display apparatus was made by following the same procedure as Example 1 with the exception that the second insulating layer having a hydrogen content of less than $3 \times 10^{21}$ atoms/cm$^3$ was not used and an interlayer insulating layer was used as a gate insulating layer of the TFT. While the TFTs were operated, the operation was gradually deviated from a normal operation. In the normal operation, an electric charge should be retained and light emission should be observed, while with the display apparatus of the present comparative example, a leak current increased with the lapse of time and the light emission became intermittent.

Example 2

In the next place, Example 2 according to the present invention will be described.

At first, as a substrate, a SiO$_2$ glass substrate (1737 manufacture by Corning Inc.) was prepared which had an ITO film with a resistivity of $1.4 \times 10^{-4}$ Ω·cm and a thickness of 100 nm formed thereon. As the pretreatment before film formation, the substrate was ultrasonically degreased and cleaned with acetone, IPA, and ultrapure water sequentially for five minutes each and then dried at 100° C. in air.

Subsequently, a lower electrode of a light-emitting layer was patterned by a photolithographic process and a wet process.

Subsequently, a film with a thickness of 200 nm was deposited by a DC sputtering process using Al—Si (5%) as a target material, and then a power supply line, a GND line, and a signal electrode line were patterned at desired positions by using a photolithographic process and a dry process. At this time, patterning was performed such that the lower electrode and the power supply line were in contact with each other.

Next, a film of a-SiNx:H was deposited thereon as an interlayer insulating layer in a thickness of 700 nm at a substrate temperature of 250° C. using a plasma-CVD process. Subsequently, contact holes were formed in desired positions, and electrodes were embedded so as to contact the GND line, and the signal electrode line.

Furthermore, films of Ti/Au/Ti were deposited in thicknesses of 5 nm/40 nm/5 nm respectively with a DC sputtering process using Au and Ti as target materials, and a scanning electrode line, two gate electrodes and an electrode for a capacitor were formed at desired positions with a photolithographic process and a lift-off process.

Thus, a matrix wiring portion and a lower electrode for a light-emitting layer were formed on the substrate, and then the gate electrode for the TFT and the electrode for the capacitor were formed thereon.

Next, a second insulating layer having a hydrogen content of less than $3 \times 10^{21}$ atoms/cm$^3$ was formed on the substrate having the matrix wiring portion formed thereon. A sintered body (with a size of 98 mm in diameter and 5 mm in thickness) having a composition of SiO$_2$ was used for the target material. A deposition chamber was controlled to reach a vacuum degree of $2.0 \times 10^{-4}$ Pa. In the deposition chamber, Ar gas was flown at 133 Pa for 25 minutes before the film formation, and pre-sputtering was performed for five minutes. During the film formation, the total pressure in the chamber was controlled to a constant value of 0.1 Pa, Ar gas was flown at 10 sccm, and the distance between the target and the film-forming substrate was set at 75 mm. The input power was RF 400 W, and the film forming rate was 7 nm/min. The deposited film thickness of the second insulating layer was 220 nm. Furthermore, contact holes were formed in the second insulating layer with a dry etching process. The dry etching was performed under the conditions of CF$_4$ gas 20 sccm, 5 Pa, and RF 150 W at an etch rate of 41 nm/min for 6.0 minutes.

Next, an amorphous oxide semiconductor was formed as the active layer of the TFT. A polycrystal sintered body (with a size of 98 mm in diameter and 5 mm in thickness) having the composition of InGaO$_3$(ZnO)$_4$ was used for the target material. The sintered body was prepared by wet mixing In$_2$O$_3$, Ga$_2$O$_3$ and ZnO (each 4N reagent) as starting materials (solvent: ethanol), followed by presintering (1,000° C.; 2 hours), dry milling, and sintering (1,500° C.; 2 hours). The target had an electrical conductivity of 12 S/cm and was in a semi-insulating state. The vacuum reached in the deposition chamber was $3.0 \times 10^{-4}$ Pa. During the film formation, the total pressure in the deposition chamber was controlled to a constant value of 0.5 Pa, and the oxygen gas ratio was controlled to 5.5%. In addition, the distance between the target and the film-forming substrate was set at 75 mm. The input power was RF 200 W, and the film-forming rate was set at 7.1 nm/min. The deposited film thickness of the amorphous oxide semiconductor was 35 nm. Furthermore, wet etching was performed by using an aqueous hydrochloric acid solution (HCl:water=1:10) to pattern the amorphous In—Ga—Zn—O.

Next, a source electrode and a drain electrode of the TFT were prepared. Au and Ti were used as target materials and films of Ti/Au/Ti were deposited in thicknesses of 5 nm/40 nm/5 nm respectively with a DC sputtering process, and the source electrode and the drain electrode were formed at desired positions with a photolithographic process and a lift-off process.

Next, on the amorphous oxide semiconductor, a film of SiO$_x$ with a thickness of 300 nm was stacked using a sputtering process by following the same procedure as the formation of the second insulating layer, and a third insulating layer was formed by patterning at desired positions by means of a photolithographic process and a lift-off process.

Subsequently, a light-emitting layer was formed on the lower electrode for the light-emitting layer. A hole injection layer was formed of 4,4'-bis[N,N-diamino]-4"-phenyl-triphenylamine in a thickness of 45 nm by using a resistive evaporation process. Then, a film of 4,4'-bis[N-(1-naphthyl)-N-phenylamino]biphenyl was formed thereon in a thickness of 25 nm as a hole-transporting layer. Subsequently, a film of 4,4'-bis(2,2'-diphenyl vinyl)-1,1'-biphenyl as a light-emitting layer was formed thereon in a thickness of 30 nm and a film of tris(8-quinolinol) aluminum as an electron-transporting layer was further formed thereon in a thickness of 15 nm, thus completing an organic EL light-emitting layer as a whole.

Furthermore, an upper electrode of the light-emitting layer was prepared by forming a film of an alloy of Al and Ag in a thickness of 50 nm with a resistive heating evaporation process, and forming an Al film thereon in a thickness of 200 nm. The upper electrode was connected to the drain electrode of the TFT.

Figure 9A:
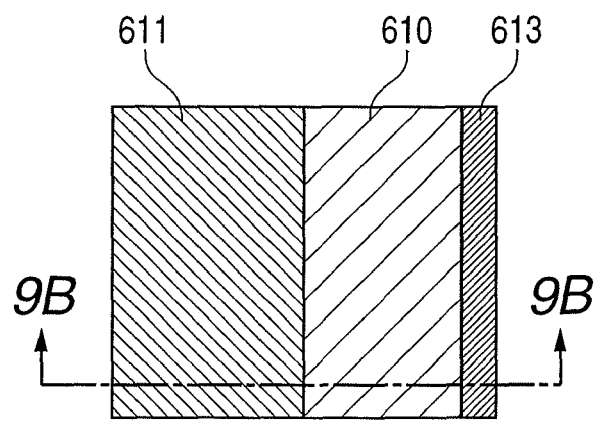
FIG. 9A is a plan view of a representative pixel portion used in a display apparatus according to an embodiment of the present invention.
Figure 9B:
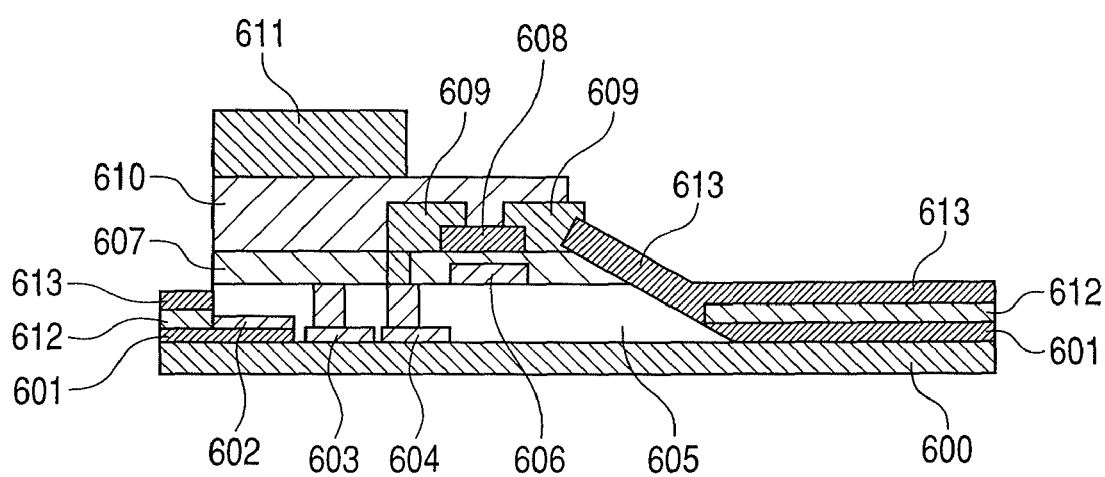
FIG. 9B is a cross-sectional view taken along line 9B-9B in FIG. 9A.

Thereafter, the substrate having the films stacked thereon was sealed with a glass cap containing a desiccant (not shown), whereby a display apparatus having basically the same configuration as that shown in FIGS. 9A and 9B was produced.

When a desired voltage and signal was given to each of the power supply line, the GND line, the signal electrode line, and the scanning electrode line of the above described device to thereby drive the TFTs, a blue light was emitted from the lower surface of the substrate, i.e., in a bottom emission type. In addition, when the TFTs were driven 1,000,000 times, there was not observed any special abnormality in light emission.

Comparative Example 2

As the present comparative example, a display apparatus was made by following the same procedure as Example 2 with the exception that the second insulating layer having a hydrogen content of less than $3 \times 10^{21}$ atoms/cm$^3$ was not used and an interlayer insulating layer was used as a gate insulating layer of the TFT. When the TFTs were operated, an electric charge was held and light emission was observed. However, with the lapse of time, a leak current gradually increased and the light emission became intermittent.

Example 3

In the next place, Example 3 according to the present invention will be described.

In the present example, a display apparatus was made by following the same procedure as in Example 1 up to the completion of the matrix wiring portion.

Next, a second insulating layer having a hydrogen content of less than $3 \times 10^{21}$ atoms/cm$^3$ was formed on the substrate having the matrix wiring portion formed thereon. A sintered body (with a size of 98 mm in diameter and 5 mm in thickness) having a composition of $Si_3N_4$ was used for the target material. A deposition chamber was controlled to reach a vacuum degree of $2.5 \times 10^{-4}$ Pa. In the deposition chamber, Ar gas was flown at 133 Pa for 20 minutes before the film formation, and pre-sputtering was performed for five minutes. During the film formation, the total pressure in the chamber was controlled to a constant value of 0.1 Pa, Ar gas was flown at 15 sccm, and the distance between the target and the film-forming substrate was set at 75 mm. The input power was RF 400 W, and the film forming rate was 6 nm/min. The deposited film thickness of the second insulating layer was 200 nm. Furthermore, contact holes were formed in the second insulating layer with a dry etching process. The dry etching was performed under the conditions of $CF_4$ gas 20 sccm, 5 Pa, and RF 160 W at an etch rate of 41 nm/min for 7 minutes.

Next, an amorphous oxide semiconductor was formed as the active layer of the TFT. A polycrystal sintered body (with a size of 98 mm in diameter and 5 mm in thickness) having the composition of $InGaO_3(ZnO)_4$ was used for the target material. The sintered body was prepared by wet mixing $In_2O_3$, $Ga_2O_3$ and ZnO (each 4N reagent) as starting materials (solvent: ethanol), followed by presintering (1,000° C.; 2 hours), dry milling, and sintering (1,500° C.; 2 hours). The target had an electrical conductivity of 12 S/cm and was in a semi-insulating state. The vacuum reached in the deposition chamber was $3.0 \times 10^{-4}$ Pa. During the film formation, the total pressure in the deposition chamber was controlled to a constant value of 0.5 Pa, and the oxygen gas ratio was controlled to 5%. In addition, the distance between the target and the film-forming substrate was set at 75 mm. The input power was RF 200 W, and the film-forming rate was set at 7.1 nm/min. The deposited film thickness of the amorphous oxide semiconductor was 30 nm. Furthermore, wet etching was performed by using an aqueous hydrochloric acid solution (HCl:water=1:10) to pattern the amorphous In—Ga—Zn—O.

Thereafter, the subsequent process was performed by following the same procedure as in Example 1, a display apparatus having basically the same configuration as that shown in FIGS. 7A to 7C was produced.

When a desired voltage and signal was given to each of the power supply line, the GND line, the signal electrode line, and the scanning electrode line of the above described device to thereby drive the TFTS, a blue light was emitted from the lower surface of the substrate, i.e., in a bottom emission type. In addition, when the TFTs were driven 1,000,000 times, there was not observed any special abnormality in light emission.

Example 4

In the next place, Example 4 according to the present invention will be described.

In the present example, a display apparatus was made by following the same procedure as in Example 2 up to the completion of the matrix wiring portion.

Next, a second insulating layer having a hydrogen content of less than $3 \times 10^{21}$ atoms/cm$^3$ was formed on the substrate having the matrix wiring portion formed thereon. A sintered body (with a size of 98 mm in diameter and 5 mm in thickness) having a composition of $Si_3N_4$ was used for the target material. A deposition chamber was controlled to reach a vacuum degree of $2.5 \times 10^{-4}$ Pa. In the deposition chamber, Ar gas was flown at 133 Pa for 20 minutes before the film formation, and pre-sputtering was performed for five minutes. During the film formation, the total pressure in the chamber was controlled to a constant value of 0.1 Pa, Ar gas was flown at 20 sccm, $O_2$ gas was flown at 3 sccm, and the distance between the target and the film-forming substrate was set at 75 mm. The input power was RF 420 W, and the film forming rate was 6 nm/min. The deposited film thickness of the second insulating layer was 200 nm. Furthermore, contact holes were formed in the second insulating layer with a dry etching process. The dry etching was performed under the conditions of $CF_4$ gas 20 sccm, 5 Pa, and RF 180 W at an etch rate of 32 nm/min for 7 minutes.

Next, an amorphous oxide semiconductor was formed as the active layer of the TFT. A polycrystal sintered body (with a size of 98 mm in diameter and 5 mm in thickness) having the composition of $InGaO_3(ZnO)_4$ was used for the target material. The sintered body was prepared by wet mixing $In_2O_3$, $Ga_2O_3$ and ZnO (each 4N reagent) as starting materials (solvent: ethanol), followed by presintering (1,000° C.; 2 hours), dry milling, and sintering (1,500° C.; 2 hours). The target had an electrical conductivity of 12 S/cm and was in a semi-insulating state. The vacuum reached in the deposition chamber was $3.0\times10^4$ Pa. During the film formation, the total pressure in the deposition chamber was controlled to a constant value of 0.5 Pa, and the oxygen gas ratio was controlled to 5.5%. In addition, the distance between the target and the film-forming substrate was set at 75 mm. The input power was RF 220 W, and the film-forming rate was set at 7.1 nm/min. The deposited film thickness of the amorphous oxide semiconductor was 30 nm. Furthermore, wet etching was performed by using an aqueous hydrochloric acid solution (HCl:water=1:10) to pattern the amorphous In—Ga—Zn—O.

Thereafter, the subsequent process was performed by following the same procedure as in Example 2, a display apparatus having basically the same configuration as that shown in FIGS. 9A and 9B was produced.

When a desired voltage and signal was given to each of the power supply line, the GND line, the signal electrode line, and the scanning electrode line of the above described device to thereby drive the TFTs, a blue light was emitted from the lower surface of the substrate, i.e., in a bottom emission type. In addition, when the TFTs were driven 1,000,000 times, there was not observed any special abnormality in light emission.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-328307, filed Dec. 5, 2006, which is hereby incorporated by reference herein in its entirety.

The invention claimed is:

1. A display apparatus, comprising:
a transistor with an active layer;
a scanning electrode line operationally connected to the transistor;
a signal electrode line operationally connected to the transistor; and
a first insulating layer in contact with at least one of the scanning electrode line and the signal electrode line,
wherein the active layer comprises an oxide which contains In and Zn and at least a part of which is amorphous,
wherein a second insulating layer containing hydrogen in an amount of less than $3\times10^{21}$ atoms/cm$^3$ is disposed between the active layer and the first insulating layer,
wherein the first insulating layer contains hydrogen, and
wherein the hydrogen content in the second insulating layer is less than the hydrogen content in the first insulating layer.

2. The display apparatus according to claim 1, wherein the transistor has a source electrode and a drain electrode which are in contact with the active layer,
wherein the active layer comprises a first portion and a second portion, with the second portion being in contact with the source electrode and the drain electrode, and
further comprising a third insulating layer in contact with the first portion of the active layer and not in contact with the second portion.

3. The display apparatus according to claim 1, wherein the third insulating layer contains hydrogen in an amount of less than $3\times10^{21}$ atoms/cm$^3$.

4. The display apparatus according to claim 1, wherein the scanning electrode line, the signal electrode line, the first insulating layer, and the transistor are disposed in series or in parallel, and
wherein the first insulating layer and the active layer are in contact with each other through the second insulating layer.

5. A method of producing a display apparatus, comprising the steps of:
forming a scanning electrode line;
forming a first insulating layer;
forming a signal electrode line;
forming a transistor with an active layer comprising an oxide which contains In and Zn and at least a part of which is amorphous; and
forming a second insulating layer containing hydrogen in an amount of less than $3\times10^{21}$ atoms/cm$^3$,
wherein the scanning electrode line and the signal electrode line are operationally connected to the transistor,
wherein the first insulating layer is in contact with at least one of the scanning electrode line and the signal electrode line,
wherein the second insulating layer is disposed between the first insulating layer and the active layer,
wherein the first insulating layer contains hydrogen, and
wherein the hydrogen content of the second insulating layer is less than the hydrogen content of the first insulating layer.

6. The method according to claim 5, wherein the formation of the transistor is performed after the formation of the scanning electrode line, the signal electrode line, and the first insulating layer.

7. A method of producing a display apparatus, comprising the steps of:
forming a matrix wiring portion having a scanning electrode line, a first insulating layer, and a signal electrode line;
forming a transistor with an active layer comprising an oxide which contains In and Zn and at least a part of which is amorphous;
forming a second insulating layer containing hydrogen in an amount of less than $3\times10^{21}$ atoms/cm$^3$ between the first insulating layer and the active layer; and
forming a light-emitting layer and a pair of electrodes sandwiching the light-emitting layer,
wherein the formation of the transistor is performed after the formation of the matrix wiring portion and either one of the pair of electrodes.

8. The method according to claim 5, wherein the transistor has a source electrode and a drain electrode which are in contact with the active layer,
wherein the active layer comprises a first portion and a second portion, with the second portion being in contact with the source electrode and the drain electrode and
further comprising a step of forming a third insulating layer after the formation of the second insulating layer so as to be in contact with the first portion of the active layer and not in contact with the second portion.

9. The method according to claim 8, wherein the third insulating layer contains hydrogen in an amount of less than $3\times10^{21}$ atoms/cm$^3$.

10. The display apparatus according to claim 1, further comprising:
a pair of electrodes; and
a light-emitting layer between the pair of electrodes,
wherein the transistor is electrically connected to one of the pair of electrodes.

11. The display apparatus according to claim 1, wherein the second insulating layer is a gate insulating layer.

12. The display apparatus according to claim 1, wherein the first insulating layer comprises at least one selected from the group consisting of silicon oxide, a silicon nitride, and silicon nitride oxide, and
wherein the second insulating layer comprises at least one selected from the group consisting of aluminum oxide, yttrium oxide, hafnium oxide, silicon oxide, and silicon nitride.

13. The method according to claim 5, further comprising the step of forming a light-emitting layer and a pair of electrodes sandwiching the light-emitting layer,
wherein the one of the pair of electrodes is electrically connected to the transistor.

14. The method according to claim 5, wherein the forming step of the transistor comprises the forming step of the second insulating layer.

15. The method according to claim 5, wherein the second insulating layer is formed by sputtering.

16. The method according to claim 6, wherein the first insulating layer comprises at least one selected from the group consisting of silicon oxide, silicon nitride, and silicon nitride oxide, and
wherein the second insulating layer comprises at least one selected from the group consisting of aluminum oxide, yttrium oxide, hafnium oxide, silicon oxide, and silicon nitride.

17. A transistor comprising:
an active layer;
a gate electrode; and
a gate insulating layer between the gate electrode and the active layer,
wherein the active layer comprises an oxide which contains In and Zn and at least a part of which is amorphous, and
wherein the gate insulating layer contains hydrogen in an amount of less than $3\times10^{21}$ atoms/cm$^3$, and
wherein the gate insulating layer is disposed between the active layer and a first insulating layer having a higher hydrogen content than the hydrogen content of the gate insulating layer.

18. The transistor according to claim 17, further comprising a source electrode and a drain electrode which are in contact with the active layer,
wherein the active layer contains a first portion and a second portion, with the second portion being in contact with the source electrode and the drain electrode of the active layer, and the first portion being in contact with a second insulating layer.

19. The transistor according to claim 18, wherein the second insulating layer contains hydrogen in an amount of less than $3\times10^{21}$ atoms/cm$^3$.

20. The transistor according to claim 17, wherein the first insulating layer and the active layer are in contact with each other through the gate insulating layer.

21. The transistor according to claim 17, wherein the gate insulating layer comprises at least one selected from the group consisting of aluminum oxide, yttrium oxide, hafnium oxide, silicon oxide, and silicon nitride, and
wherein the first insulating layer comprises at least one selected from the group consisting of silicon oxide, silicon nitride, and silicon nitride oxide.

* * * * *